US009652948B2

United States Patent
Hajati

(10) Patent No.: US 9,652,948 B2
(45) Date of Patent: *May 16, 2017

(54) HAPTIC ACTUATOR INCLUDING CIRCUITRY FOR GENERATING DRIVE WAVEFORMS BASED UPON A BEAT FREQUENCY AND RELATED METHODS

(71) Applicant: Apple Inc., Cupertino, CA (US)

(72) Inventor: Arman Hajati, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/819,829

(22) Filed: Aug. 6, 2015

(65) Prior Publication Data

US 2017/0039824 A1    Feb. 9, 2017

(51) Int. Cl.
G08B 6/00    (2006.01)
G06F 3/01    (2006.01)
B06B 1/02    (2006.01)
H01L 41/09   (2006.01)

(52) U.S. Cl.
CPC ............ *G08B 6/00* (2013.01); *B06B 1/0276* (2013.01); *G06F 3/016* (2013.01); *H01L 41/09* (2013.01)

(58) Field of Classification Search
CPC ......... G08B 6/00; G06F 3/016; B06B 1/0276; H01L 41/09
See application file for complete search history.

(56) References Cited

U.S. PATENT DOCUMENTS

| 8,169,402 | B2 | 5/2012 | Shahoian et al. |
| 2012/0025742 | A1* | 2/2012 | Masahiko ............ B06B 1/0207 318/114 |
| 2014/0197936 | A1 | 7/2014 | Biggs et al. |
| 2015/0109223 | A1 | 4/2015 | Kessler et al. |
| 2015/0116205 | A1 | 4/2015 | Westerman et al. |
| 2015/0130730 | A1 | 5/2015 | Harley et al. |
| 2016/0258758 | A1* | 9/2016 | Houston ............ G01C 21/20 |

FOREIGN PATENT DOCUMENTS

| WO | 2013169299 | A1 | 11/2013 |
| WO | 2013169303 | A1 | 11/2013 |
| WO | 2013169305 | A1 | 11/2013 |
| WO | 2013170099 | A1 | 11/2013 |
| WO | 2013188307 | A2 | 12/2013 |
| WO | 2014018111 | A1 | 1/2014 |
| WO | 2015020663 | A1 | 2/2015 |

OTHER PUBLICATIONS

Product Specification Sheet: GEEPLUS, VIBRO1 Vibration Actuator, 2 pages, www.geeplus.biz, downloaded on Jul. 15, 2015.
Hajati, Arman, U.S. Appl. No. 14/819,900, filed Aug. 6, 2015.

* cited by examiner

*Primary Examiner* — Leon Flores
(74) *Attorney, Agent, or Firm* — Allen, Dyer, Doppelt, Milbrath & Gilchrist, P.A. Attorneys at Law

(57) ABSTRACT

A haptic actuator may include a housing, at least one coil carried by the housing, and a field member movable within the housing responsive to the at least one coil. The housing, at least one coil, and field member may define a resonant frequency. The haptic actuator may also include drive circuitry coupled to the at least one coil and being capable of generating first and second drive waveforms having respective different frequencies spaced about the resonant frequency to drive the field member at a beat frequency lower than the resonant frequency.

24 Claims, 5 Drawing Sheets

HAPTIC ACTUATOR INCLUDING CIRCUITRY FOR GENERATING DRIVE WAVEFORMS BASED UPON A BEAT FREQUENCY AND RELATED METHODS

TECHNICAL FIELD

The present disclosure relates to the field of electronics, and, more particularly, to the field of haptics.

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

A haptic actuator may include a housing, at least one coil carried by the housing, and a field member movable within the housing responsive to the at least one coil. The housing, at least one coil, and field member may define a resonant frequency. The haptic actuator may also include drive circuitry coupled to the at least one coil and being capable of generating first and second drive waveforms having respective different frequencies spaced about the resonant frequency to drive the field member at a beat frequency lower than the resonant frequency. Accordingly, the field member may move based upon the beat frequency, which for example, may permit operation without hitting any mechanical stops and, for example, in multiple dissimilar modes operating at different frequencies.

The first waveform may have a frequency of x*m, and the second waveform has a frequency of x*n, wherein m and n are integers. The first and second frequencies may be within ±30% of the resonant frequency, for example.

The first and second drive waveforms may be equally spaced about the resonant frequency, for example. The first and second drive waveforms may be first and second sinusoidal drive waveforms.

The field member may include at least one permanent magnet adjacent the at least one coil. The field member may include at least one mass coupled to the at least one permanent magnet, for example.

The haptic actuator may include at least one biasing member between the field member and the housing. The at least one biasing member may be at least one spring, for example. The haptic actuator may also include at least one mechanical limit stop defined between the housing and the field member.

An electronic device aspect is directed to an electronic device that may include a housing, wireless communications circuitry carried by the housing, and a haptic actuator carried by the housing. The haptic actuator may include an actuator housing, at least one coil carried by the housing, and a field member movable within the housing responsive to the at least one coil. The housing, at least one coil, and field member may define a resonant frequency. The haptic actuator may also include drive circuitry coupled to the at least one coil and that may capable of generating first and second drive waveforms having respective different frequencies spaced about the resonant frequency to drive the field member at a beat frequency lower than the resonant frequency.

A method aspect is directed to a method of operating a haptic actuator that includes a housing, at least one coil carried by the housing, and a field member movable within the housing responsive to the at least one coil, the housing, at least one coil, and field member defining a resonant frequency. The method may include using drive circuitry coupled to the at least one coil and to generate first and second drive waveforms having respective different frequencies spaced about the resonant frequency to drive the field member at a beat frequency lower than the resonant frequency.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Prime notation is used to refer to like elements in different embodiments.

Figure 1:
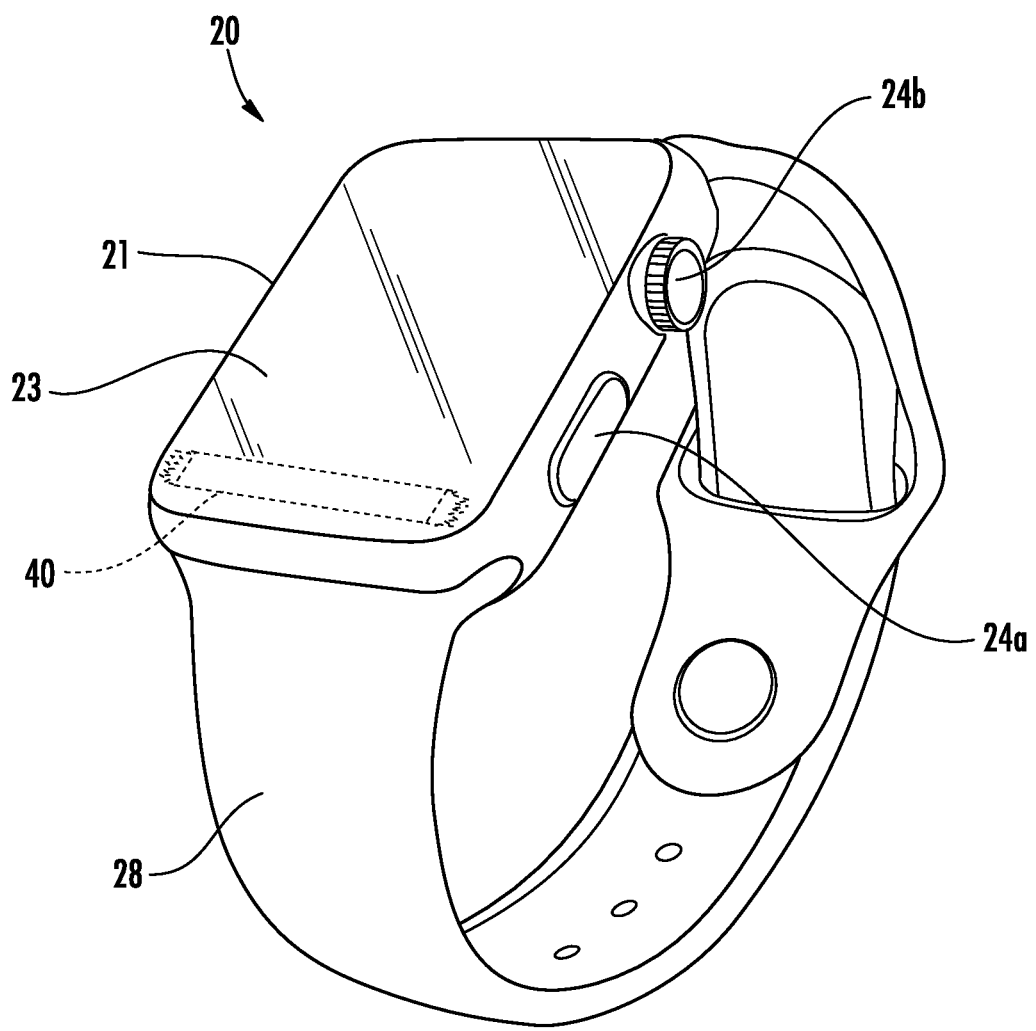
FIG. 1 is a perspective view of an electronic device including a haptic actuator according to an embodiment of the present invention.
Figure 2:
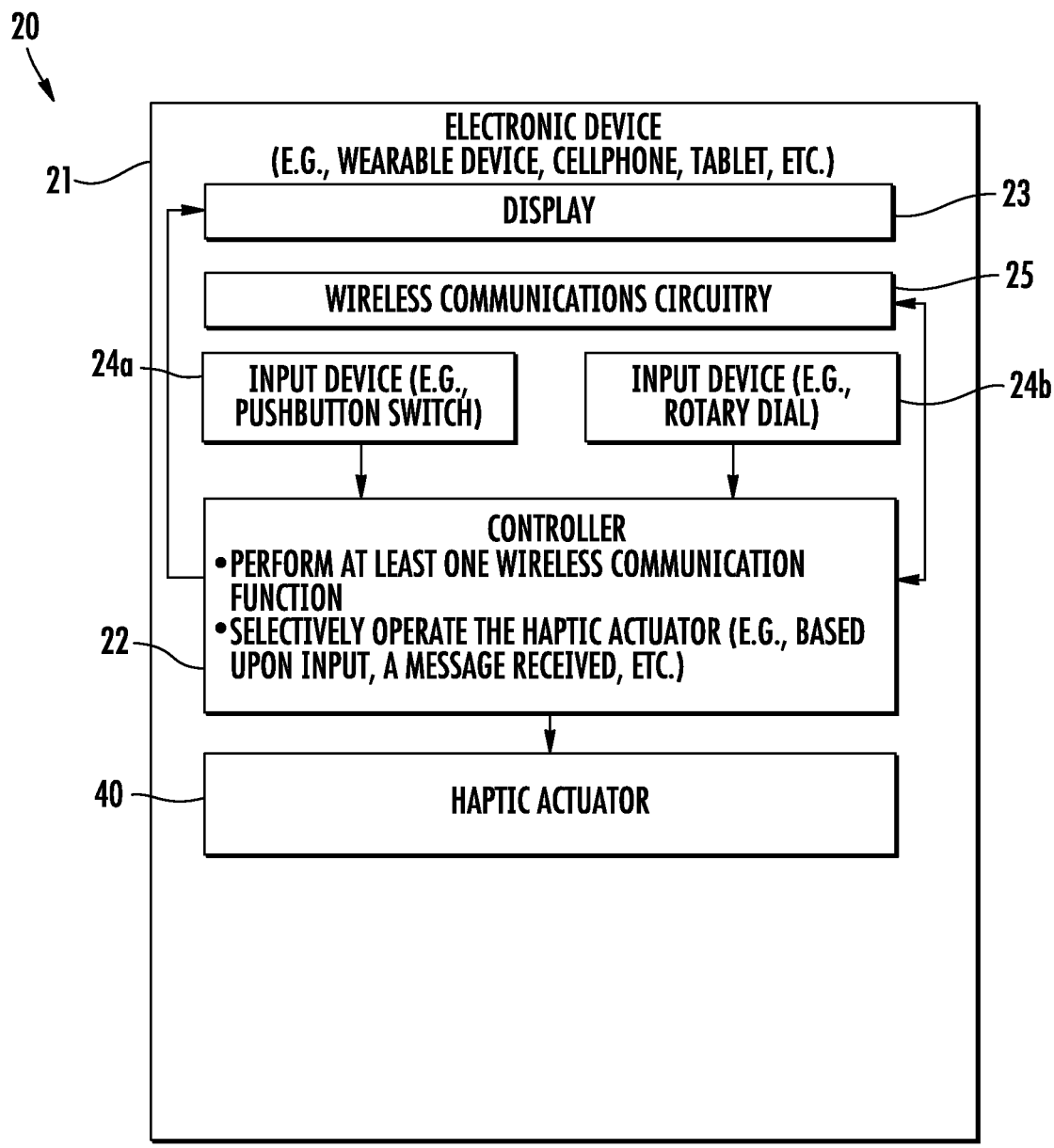
FIG. 2 is a schematic block diagram of the electronic device of FIG. 1.

Referring initially to FIGS. 1 and 2, an electronic device 20 illustratively includes a device housing 21 and a controller 22 carried by the device housing. The electronic device 20 is illustratively a mobile wireless communications device, for example, a wearable wireless communications device, and includes a band 28 or strap for securing it to a user. The electronic device 20 may be another type of electronic device, for example, a cellular telephone, a tablet computer, a laptop computer, etc.

Wireless communications circuitry 25 (e.g. cellular, WLAN Bluetooth, etc.) is also carried within the device housing 21 and coupled to the controller 22. The wireless communications circuitry 25 cooperates with the controller 22 to perform at least one wireless communications function, for example, for voice and/or data. In some embodiments, the electronic device 20 may not include wireless communications circuitry 25.

A display 23 is also carried by the device housing 21 and is coupled to the controller 22. The display 23 may be a liquid crystal display (LCD), for example, or may be another type of display, as will be appreciated by those skilled in the art.

Finger-operated user input devices 24a, 24b, illustratively in the form of a pushbutton switch and a rotary dial are also carried by the device housing 21 and are coupled to the controller 22. The pushbutton switch 24a and the rotary dial 24b cooperate with the controller 22 to perform a device function in response to operation thereof. For example, a device function may include a powering on or off of the electronic device 20, initiating communication via the wireless communications circuitry 25, and/or performing a menu function.

The electronic device 20 illustratively includes a haptic actuator 40. The haptic actuator 40 is coupled to the controller 22 and provides haptic feedback to the user in the form of relatively long and short vibrations or "taps", particularly when the user is wearing the electronic device 20. The vibrations may be indicative of a message received, and the duration of the vibration may be indicative of the type of message received. Of course, the vibrations may be indicative of or convey other types of information. More particularly, Electronic the controller 22 applies a voltage to move a moveable body or masses between first and second positions.

While a controller 22 is described, it should be understood that the controller 22 may include one or more of a processor and other circuitry to perform the functions described herein.

Figure 3:
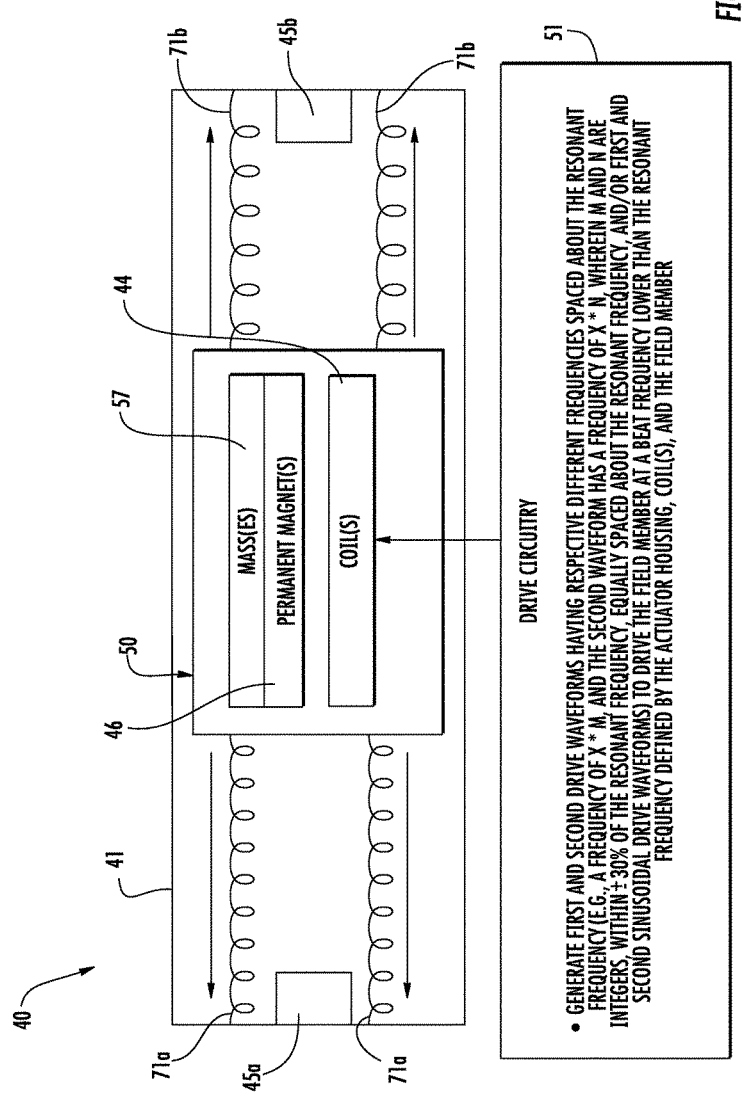
FIG. 3 is a more detailed schematic diagram of the haptic actuator of FIG. 1.

Referring now additionally to FIG. 3, the haptic actuator 40 includes a housing 41 and a coil 44 carried by the housing. Of course, there may be more than one coil carried by the housing 41.

A field member 50 is movable within the housing responsive the coil 44. The movement of the field member 50 creates the haptic feedback, or tapping, as will be appreciated by those skilled in the art. While the movement of the field member 50 may be described as being moveable in one direction, i.e., a linear haptic actuator, it should be understood that in some embodiments, the field member may be movable in other directions, i.e., an angular haptic actuator, or may be a combination of both a linear and an angular haptic actuator. The field member 50 may include a mass 57. The mass 57 may be shaped for or have a particular mass amount for a particular haptic sensation or desired application. Of course, there may be more than one mass 57.

The field member 50 also includes a permanent magnet 46 adjacent the coil 44 and coupled to the mass 57. More than permanent magnet 46 may be included.

The haptic actuator 40 also includes biasing members between the field member 50 and the actuator housing 41. The biasing members may be springs in the form of the illustrated springs 71a, 71b, for example, and, more particularly, coil springs, defining part of a suspension system. The biasing members 71a, 71b may be other types of biasing members, for example, coil springs, leaf springs, and flexures. The biasing members may also or additionally include magnetic springs that, through interaction with the permanent magnet(s) 46 and/or ferritic parts of the actuator housing 41, if any, store and amplify the energy in the form of elastic/magnetic energy. The biasing members provide biasing of the field member in an initial at-rest position.

The suspension system may also include shafts, linear/angular bearings, sliding bearings, flexures, multi-bar linkage mechanisms, and other springs that may enable motion of the field member 50 in the desired direction (e.g. X axis in a linear actuator or around a certain axis in an angular actuator) while constraining motion in other degrees of freedom. The suspension system may include other and/or additional components for maintaining the suspension of the field member 50 as well as constrain movement of the field member.

The haptic actuator 40 also includes mechanical limit stops 45a, 45b defined between the housing 41 and the field member 50. The mechanical limit stops 45a, 45b limit the movement of the field member to a desired range. It will be appreciated by those skilled in the art that the mechanical limit stops 45a, 45b can be separate from actuator housing 41 or part of the actuator housing.

Typically, drive circuitry generates a sinusoidal drive waveform that drives the field member to move from an initial at-rest position. However, as will be appreciated by those skilled in the art, in a stationary or at-rest position, the field member 50 has a static friction associated with it which may cause the field member to "get stuck" despite the application of a drive voltage. A certain amount of force or voltage is thus needed to overcome this static friction force to cause the field member 50 to move. One approach to drive the field member 50 from the at-rest position is to increase the drive voltage or amplitude of the sinusoidal drive waveform. However, once the static friction force is overcome, the field member 50 typically rapidly accelerates and crashes or bangs into the mechanical limit stops 45a, 45b.

In some applications it may be particularly desirable to not have the field member 50 hit or bang into the mechanical limit stops 45a, 45b as this may generate a corresponding "banging" noise. To reduce the amount of noise, for example, caused by the increased amplitude, the haptic actuator 40 includes drive circuitry 51 that generates first and second drive waveforms, for example, sinusoidal waveforms, having respective different frequencies spaced about a resonant frequency defined by the actuator housing 41, the coil 44, and field member 50. By generating the first and the second drive waveforms, the drive circuitry 51 drives field member at a beat frequency lower than the resonant frequency.

As will be appreciated by those skilled in the art, a beat is interference between two waveforms of slightly different frequencies, which is generally perceived by a user as periodic variations in volume whose rate is the difference between the two waveforms having different frequencies. The haptic feedback or sensation generated by the haptic actuator 40 is generally not sensitive to phase, but instead to amplitude or intensity of the vibration, which may be defined by the envelope of the beat frequency or mode. As a result, for example, a low-frequency "vibe" can be generated by generating the first and second drive waveforms to have frequencies that are around the resonant frequency.

In particular, to drive the field member 50 at the beat frequency, the drive circuitry 51 generates the first waveform to have a frequency of x*m, and the second waveform to have a frequency of x*n, wherein m and n are integers. In some example embodiments, the first and second frequencies are within ±30% of the resonant frequency, and the first and second drive waveforms may be equally spaced about the resonant frequency. Of course, is some embodiments, the first and second frequencies may be within another range of the resonant frequency and/or may not be equally spaced about the resonant frequency.

Figure 4:
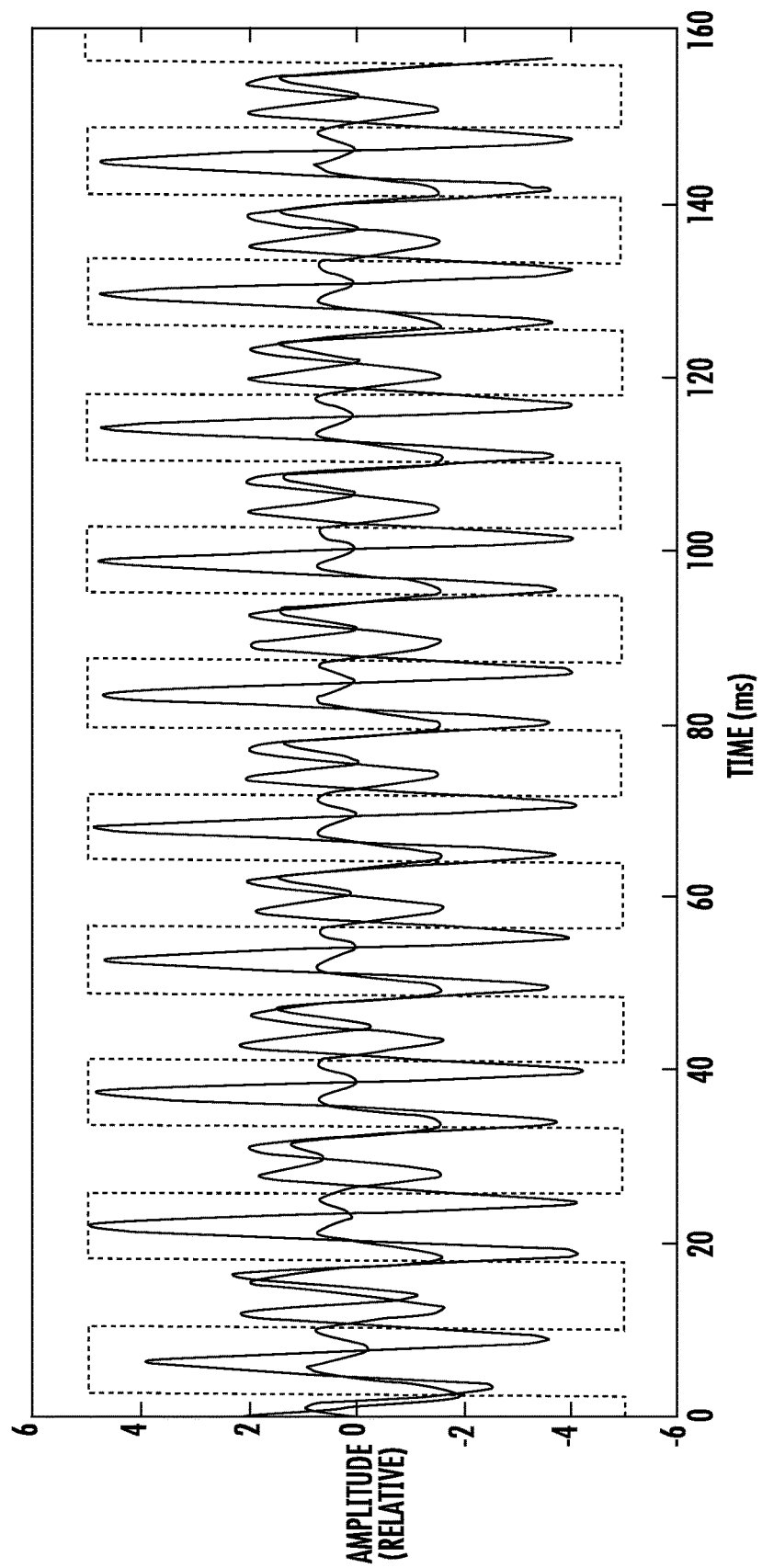
FIG. 4 is a graph of simulated linear simulation results for a haptic actuator in accordance with an embodiment of the present invention.

Using the drive circuitry 51 to drive the field member 50 with the beat frequency may be particularly advantageous for generating different types of haptic feedback, for example, sharp and crisp "taps" with a relatively high-frequency short-duration waveform and an long and smooth "vibes" with a relatively low-frequency, long-duration waveform, with a single-frequency actuator. As will be appreciated by those skilled in the art, a single frequency actuator, for example, generally has a relatively small bandwidth of operation around its resonant frequency. By using the drive circuitry 51 to drive the field member 50 with the beat frequency (i.e., based upon two frequencies around the resonant frequency), the haptic actuator 40 may more efficiency generate both "taps" and "vibes," and while reducing occurrences of banging of the field member into the actuator housing 41. For example, a 170 Hz haptic actuator may be driven with first and second waveforms having respective frequencies at 208.8 Hz and 138.8 Hz to generate a 'perfect fifth' beat at 70 Hz, which may be particularly ideal for a "vibe." Referring briefly to the graph 60 in FIG. 4, linear simulation results for the haptic actuator 40 are illustrated.

A method aspect is directed to a method of operating a haptic actuator that includes an actuator housing 41, a coil 44 carried by the actuator housing, and a field member 50 movable within the actuator housing responsive to the coil. The actuator housing 41, the coil 44, and the field member 50 define a resonant frequency. The method includes using drive circuitry 51 coupled to the coil 44 to generate first and second drive waveforms having respective different frequencies spaced about the resonant frequency to drive the field member at a beat frequency lower than the resonant frequency.

Figure 5:
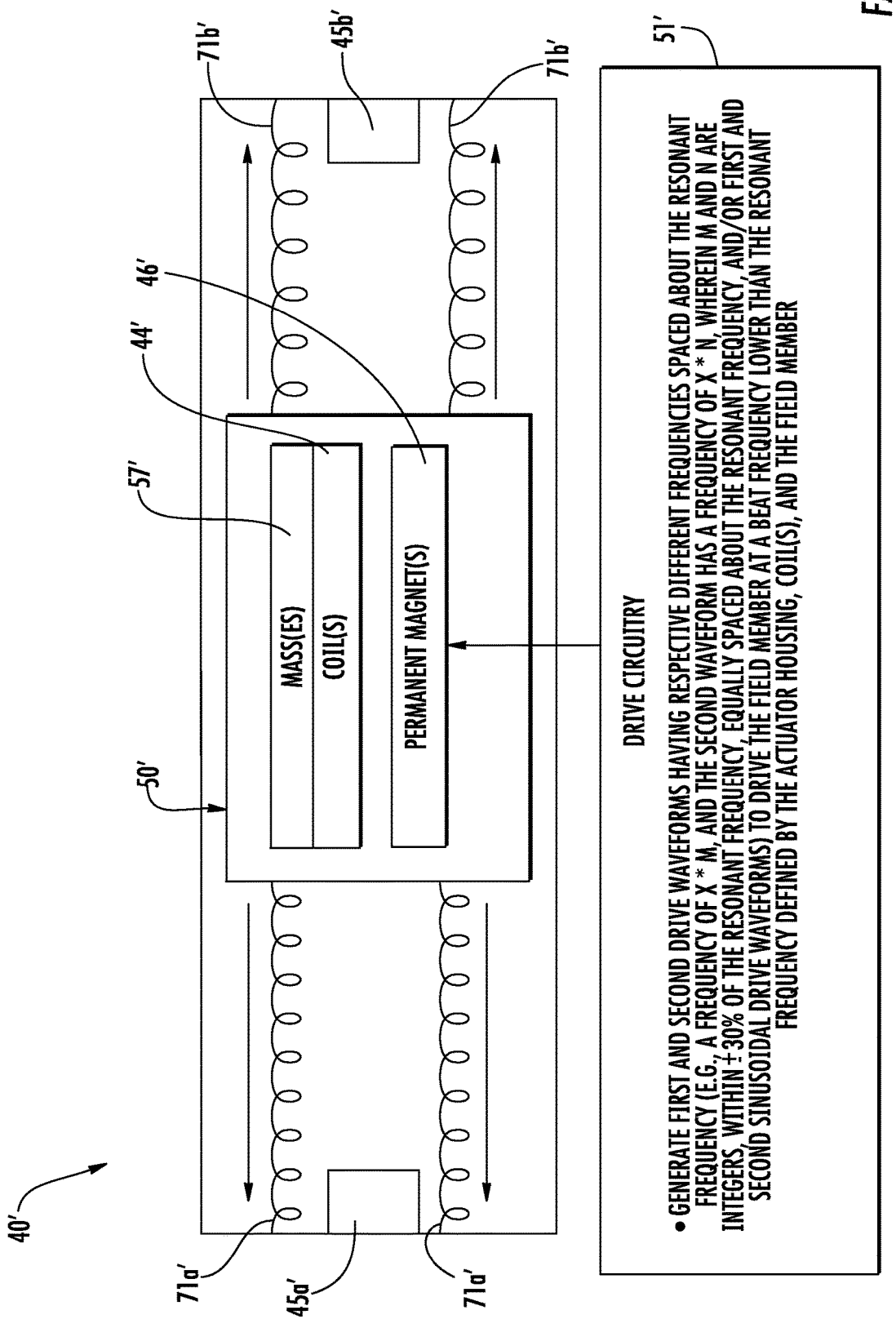
FIG. 5 is a schematic diagram of a haptic actuator according to another embodiment.

Referring now to FIG. 5, in another embodiment, the haptic actuator 40' may include a permanent magnet 46' carried by the housing 41', and the field member 50' may include one or more coils 44' that cooperate with the permanent magnet. In other words, in contrast to the embodiment described above, the permanent magnet 46' is stationary (i.e., carried by the housing 41') and the coils 44', as part of the field member 50' are moving (i.e., connected to the mass). Of course, there may be any number of coils and/or permanent magnets.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A haptic actuator comprising:
a housing;
at least one coil carried by the housing;
a field member movable within the housing responsive to the at least one coil;
the housing, at least one coil, and field member defining a resonant frequency; and
drive circuitry coupled to the at least one coil and being capable of generating first and second drive waveforms having respective different frequencies higher and lower than the resonant frequency to drive the field member at a beat frequency lower than the resonant frequency.

2. The haptic actuator of claim 1 wherein the first waveform has a frequency of x*m, and the second waveform has a frequency of x*n, wherein m and n are integers, and x is a frequency.

3. The haptic actuator of claim 1 wherein the first and second frequencies are within ±30% of the resonant frequency.

4. The haptic actuator of claim 1 wherein the first and second drive waveforms are equally spaced from the resonant frequency.

5. The haptic actuator of claim 1 wherein the first and second drive waveforms comprise first and second sinusoidal drive waveforms.

6. The haptic actuator of claim 1 wherein the field member comprises at least one permanent magnet adjacent the at least one coil.

7. The haptic actuator of claim 6 wherein the field member comprises at least one mass coupled to the at least one permanent magnet.

8. The haptic actuator of claim 1 further comprising at least one biasing member between the field member and the housing.

9. The haptic actuator of claim 8 wherein the at least one biasing member comprises at least one spring.

10. The haptic actuator of claim 1 further comprising at least one mechanical limit stop defined between the housing and the field member.

11. An electronic device comprising:
a housing;
wireless communications circuitry carried by the housing;
a haptic actuator carried by the housing and comprising
an actuator housing,
at least one coil carried by the actuator housing,
a field member movable within the actuator housing responsive to the at least one coil,
the actuator housing, at least one coil, and field member defining a resonant frequency, and
drive circuitry coupled to the at least one coil and being capable of generating first and second drive waveforms having respective different frequencies higher and lower than the resonant frequency to drive the field member at a beat frequency lower than the resonant frequency; and
a controller coupled to the wireless communications circuitry and the haptic actuator, and capable of performing at least one wireless communication function and selectively operating the haptic actuator.

12. The electronic device of claim 11 wherein the first waveform has a frequency of x*m, and the second waveform has a frequency of x*n, wherein m and n are integers, and x is a frequency.

13. The electronic device of claim 11 wherein the first and second frequencies are within ±30% of the resonant frequency.

14. The electronic device of claim 11 wherein the first and second drive waveforms are equally spaced from the resonant frequency.

15. The electronic device of claim 11 wherein the first and second drive waveforms comprise first and second sinusoidal drive waveforms.

16. The electronic device of claim 11 wherein the field member comprises at least one permanent magnet adjacent the at least one coil.

17. The electronic device of claim 16 wherein the field member comprises at least one mass coupled to the at least one permanent magnet.

18. The electronic device of claim 11 further comprising at least one biasing member between the field member and the actuator housing.

19. The electronic device of claim 11 further comprising at least one mechanical limit stop defined between the actuator housing and the field member.

20. A method of operating a haptic actuator comprising a housing, at least one coil carried by the housing, and a field member movable within the housing responsive to the at least one coil, the housing, at least one coil, and field member defining a resonant frequency, the method comprising:

using drive circuitry coupled to the at least one coil to generate first and second drive waveforms having respective different frequencies higher and lower than the resonant frequency to drive the field member at a beat frequency lower than the resonant frequency.

21. The method of claim 20 wherein the drive circuitry is used to generate the first waveform to have a frequency of x*m, and the second waveform to have a frequency of x*n, wherein m and n are integers, and x is a frequency.

22. The method of claim 20 wherein the drive circuitry is used to generate the first and second frequencies to be within ±30% of the resonant frequency.

23. The method of claim 20 wherein the drive circuitry is used to generate the first and second drive waveforms to be equally spaced from the resonant frequency.

24. The method of claim 20 wherein the first and second drive waveforms comprise first and second sinusoidal drive waveforms.

\* \* \* \* \*